(12) United States Patent  (10) Patent No.: US 9,361,959 B2
Bhatia et al.  (45) Date of Patent: Jun. 7, 2016

(54) LOW POWER DOUBLE PUMPED MULTI-PORT REGISTER FILE ARCHITECTURE

(71) Applicant: Apple Inc., Cupertino, CA (US)

(72) Inventors: Ajay Kumar Bhatia, Saratoga, CA (US); Aravind Kandala, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/467,376

(22) Filed: Aug. 25, 2014

(65) Prior Publication Data

US 2016/0055889 A1    Feb. 25, 2016

(51) Int. Cl.
   *G11C 7/10*   (2006.01)
   *G11C 7/22*   (2006.01)

(52) U.S. Cl.
   CPC .............. *G11C 7/222* (2013.01); *G11C 7/106* (2013.01); *G11C 7/1078* (2013.01); *G11C 7/1087* (2013.01); *G11C 7/1093* (2013.01)

(58) Field of Classification Search
   CPC ..................................... G11C 7/1078
   USPC .................................. 365/233.13
   See application file for complete search history.

(56) References Cited

U.S. PATENT DOCUMENTS

| 6,943,595 | B2 * | 9/2005 | Sugimoto ............. H03K 5/135 327/141 |
| 7,135,899 | B1 * | 11/2006 | Sancheti .................. G06F 1/10 327/144 |
| 7,656,742 | B2 | 2/2010 | Kim et al. |
| 7,778,105 | B2 | 8/2010 | Golla et al. |
| 8,514,652 | B2 | 8/2013 | Nukaraju et al. |
| 2014/0149817 | A1 | 5/2014 | Adams et al. |

* cited by examiner

*Primary Examiner* — Son Mai
(74) *Attorney, Agent, or Firm* — Meyertons, Hood, Kivlin, Kowert & Goetzel, P.C.

(57) ABSTRACT

Embodiments that may allow for selectively tuning a delay of individual write paths within a memory are disclosed. The memory may comprise a memory array, a first data latch, a second data latch, and circuitry. The first and second data latches may be configured to each sample a respective data value, responsive to detecting a first edge of a first clock signal. The circuitry may be configured to detect the first edge of the first clock signal, and select an output of the first data latch responsive to detecting the first edge of the first clock signal. The circuitry may detect a subsequent opposite edge of the first clock signal, and select an output of the second data latch responsive to sampling the opposite edge of the first clock signal.

20 Claims, 10 Drawing Sheets

LOW POWER DOUBLE PUMPED MULTI-PORT REGISTER FILE ARCHITECTURE

BACKGROUND

1. Technical Field

Embodiments described herein relate to integrated circuits, and more particularly, to techniques for tuning circuit paths within a multi-port memory.

2. Description of the Related Art

Processors, memories, and other types of integrated circuits, typically include a number of logic circuits composed of interconnected transistors fabricated on a semiconductor substrate. Such logic circuits may be constructed according to a number of different circuit design styles. For example, combinatorial logic may be implemented via a collection of un-clocked static complementary metal-oxide semiconductor (CMOS) gates situated between clocked state elements such as flip-flops or latches. Alternatively, depending on design requirements, some combinatorial logic functions may be implemented using clocked dynamic logic, such as domino logic gates.

Wires formed from metallization layers available on a semiconductor manufacturing process may be used to connect the various clocked state elements and logic gates. Manufacturing variation from chip to chip as well as differences in physical routing of the wires may result in different propagation times between logic gates.

During operation, voltage levels of various on-chip power supplies may vary. Such variation may be the result of voltage drops across parasitic circuit elements during increased levels of activity of logic switching. In addition, a temperature of an integrated circuit may fluctuate in response to the ambient temperature as well as the level of activity of logic switching. Fluctuation of voltage levels and temperature may also impact the propagation delays between logic gates.

A system-on-a-chip (SoC) may include one or more processors along with various other functional blocks implemented within a single integrated circuit. SoCs may also include one or more volatile memories such as static random access memory (SRAM) and/or register files. In some instances, a volatile memory may be capable of receiving data values for storage from two or more sources in a single system clock cycle. Such memories may be referred to as multi-port memories. Furthermore, some such multi-port memories may be capable of writing two received data values in a single system clock cycle, referred to as double pumped writes.

A double pumped, multi-port memory may write a first data value during a first half of a system clock cycle and write a second data value during a second half of the same cycle. A double pumped memory may, therefore, be more sensitive to variations in manufacturing as well as voltage and temperature effects than a single port memory. If the write circuitry of the memory is sensitive to such effects, then processing variations may cause low yields during a production test flow and/or may limit voltage and temperature operating ranges of the SoC.

SUMMARY OF THE EMBODIMENTS

Various embodiments of a method and a memory for tuning delay in a write path are disclosed. Broadly speaking, a memory and a method are contemplated in which memory may comprise a memory array, a first data latch, a second data latch, and circuitry. The first and second data latches may be configured to each sample a respective data value, responsive to detecting a rising edge of the first clock signal. The circuitry may be configured to detect the rising edge of the first clock signal, and select an output of the first data latch responsive to detecting the first edge of the first clock signal. The circuitry may detect a subsequent opposite edge of the first clock signal, and select an output of the second data latch responsive to sampling the opposite edge of the first clock signal.

In a further embodiment, the circuitry may be further configured to generate a second clock signal dependent upon the first clock signal, wherein a frequency of the second clock signal is twice a frequency of the first clock signal. The circuitry may be further configured to generate a third clock signal dependent upon the first clock signal, wherein a frequency of the third clock signal is twice the frequency of the first clock signal, and wherein a duty cycle of the third clock signal is different than a duty cycle of the second clock signal. The circuitry may then select one of the second clock signal and the third clock signal to generate a decoding clock signal, wherein the selection is dependent upon one or more operational parameters.

In still further embodiment, the circuitry may be further configured to decode at least a portion of a first address responsive to a first active edge of the decoding clock signal, and decode at least a portion of a second address responsive to a second active edge of the decoding clock signal. The first address may indicate a location in the memory array to store the first data value and the second address may indicate a location in the memory array to store the second data value.

In one embodiment, to detect the first edge of the first clock signal, the circuitry may be further configured to set a latch. To detect the subsequent opposite edge of the first clock signal, the circuitry may be further configured to reset the latch responsive to the subsequent falling edge of the first clock signal and a determination that the latch is set.

In a given embodiment, the circuitry may be further configured to delay storage of the first data to the memory array for a predetermined period of time, and to delay storage of the second data to the memory array for another predetermined period of time. The predetermined period of time may be dependent upon the one or more operational parameters.

In an example embodiment, the one or more operational parameters may include an indication of a voltage level of a power supply coupled to the memory. In another embodiment, the first edge of the first clock signal may correspond to a rising edge, and the opposite edge of the first clock signal may correspond to a falling edge.

BRIEF DESCRIPTION OF THE DRAWINGS

The following detailed description makes reference to the accompanying drawings, which are now briefly described.

Figure 1:
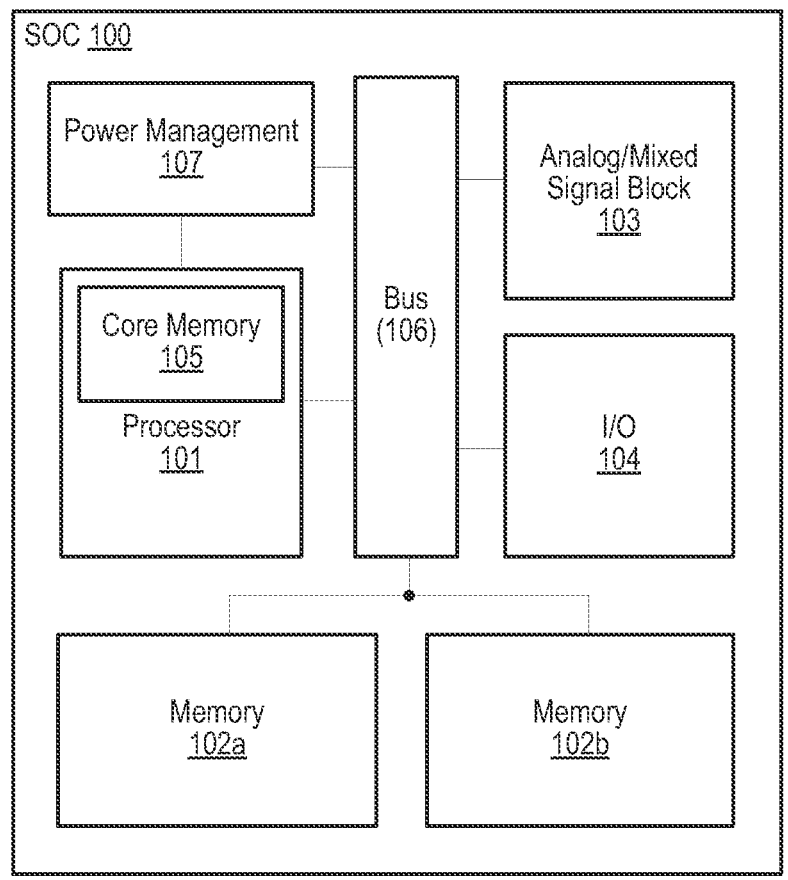
FIG. 1 illustrates a block diagram of an embodiment of an SoC.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

An SoC may include one or more processors along with various other functional blocks implemented within a single integrated circuit. SoCs may also include one or more double pumped/multi-port volatile memories such as static random access memory (SRAM) and/or register files to support various processors and other functional blocks required to share data storage space. Such SoCs may also implement dynamic voltage and frequency scaling (DVFS) to reduce power consumption during periods of lower activity and increase performance during periods of higher activity.

Dynamic voltage scaling, i.e., the adjustment of voltage levels of one or more internal power supplies on SoC, may be employed to reduce dynamic and leakage power consumption within a mobile device. Periods of reduced activity for portions of a SoC may be detected and a voltage level of a corresponding power supplies for the identified portions may be reduced. Similarly, dynamic frequency scaling may be employed by reducing a frequency of a clock signal provided to the identified portions as well. Such DVFS adjustments to power supply voltage levels and clock signal frequencies may allow for reduced power consumption.

Individual functional blocks within an SoC, such as, e.g., a processor or memory, may include multiple circuit paths (both clock and data paths) each of which may include multiple logic gates. As power supply voltage levels are changed in response to the dynamic voltage scaling, timing relationships between signals included in different circuits paths may change. In some cases, such a change in the timing relationship between signals may result in a functional failure within the SoC. For example, if a data path is delayed relative to an associated clock path, the data may fail to arrive at a flip-flop or latch circuit with sufficient setup time, resulting in the flip-flop or latch circuit capturing incorrect data. A double pumped, multi-port may be more sensitive to DVFS variations than a single port memory.

The embodiments illustrated in the drawings and described below may provide various techniques for handling DVFS sensitivities within a double pumped, multi-port memory. Such techniques may include adding or subtracting delay within circuit paths to maintain adequate timing margin across a range of operating conditions, generating multiple clock signals and selecting one dependent upon certain operational parameters and latching sensitive signals to avoid unintended transitions.

System-on-a-Chip Overview

A block diagram of an SoC is illustrated in FIG. 1. In the illustrated embodiment, the SoC 100 includes a processor 101 coupled to memory blocks 102a and 102b, an analog/mixed-signal block 103, an I/O block 104, and a power management unit 107, through a system bus 106. Processor 101 is also coupled directly to a core memory 105. In various embodiments, SoC 100 may be configured for use in various mobile computing applications such as, e.g., tablet computers, smartphones, or wearable devices.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include multiple CPU cores. In some embodiments, processor 101 may include one or more register files and memories.

In various embodiments, processor 101 may implement any suitable instruction set architecture (ISA), such as, e.g., PowerPC™, or x86 ISAs, or combination thereof. Processor 101 may include one or more bus transceiver units that allow processor 101 to communication to other functional blocks within SoC 100 such as, memory blocks 102a and 102b, for example.

Memory 102a and memory 102b may include any suitable type of memory such as, for example, a Dynamic Random Access Memory (DRAM), a Static Random Access Memory (SRAM), a Read-only Memory (ROM), Electrically Erasable Programmable Read-only Memory (EEPROM), a FLASH memory, a Ferroelectric Random Access Memory (FeRAM), Resistive Random Access Memory (RRAM or ReRAM), or a Magnetoresistive Random Access Memory (MRAM), for example. Some embodiments may include a single memory, such as memory 102a and other embodiments may include more than two memory blocks (not shown). Memory 102a and memory 102b may be multiple instantiations of the same type of memory or may be a mix of different types of memory. In some embodiments, memory 102a and memory 102b may be configured to store program instructions that may be executed by processor 101. Memory 102a and memory 102b may, in other embodiments, be configured to store data to be processed, such as graphics data for example.

Analog/mixed-signal block 103 may include a variety of circuits including, for example, an analog-to-digital converter (ADC) and a digital-to-analog converter (DAC) (neither shown). One or more clock sources may also be included in analog/mixed signal block 103, such as a crystal oscillator, a phase-locked loop (PLL) or delay-locked loop (DLL). In some embodiments, analog/mixed-signal block 103 may also include radio frequency (RF) circuits that may be configured for operation with cellular or other wireless networks. Analog/mixed-signal block 103 may include one or more voltage regulators to supply one or more voltages to various functional blocks and circuits within those blocks.

I/O block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol, or IEEE 1394 (Firewire®) protocol, and may allow for program code and/or program instructions to be transferred from a peripheral storage device for execution by processor 101. In one embodiment, I/O block 104 may be configured to perform the data processing necessary to implement an Ethernet (IEEE 802.3) networking standard.

Core memory 105 may, in some embodiments, be configured to store frequently used instructions and data for the processor 101. In other embodiments, core memory 105 may be part of an instruction and/or data queue for one or more processing cores in processor 101. Core memory 105 may be comprised of SRAM, DRAM, register files or any other suitable type of memory. In some embodiments, core memory 105 may include a combination of memory types in multiple memory arrays. Core memory 105 may be a part of a processor core complex (i.e., part of a cluster of processors) as part of processor 101 or, in other embodiments, it may be a separate functional block from processor 101. Some or all of core memory 105 may be of a double pumped, multi-port design style.

System bus 106 may be configured as one or more buses to couple processor 101 to the other functional blocks within the SoC 100 such as, e.g., memory 102a, and I/O block 104. In some embodiments, system bus 106 may include interfaces coupled to one or more of the functional blocks that allow a particular functional block to communicate through the link. In some embodiments, system bus 106 may allow movement of data and transactions between functional blocks without intervention from processor 101. For example, data received through the I/O block 104 may be stored directly to memory 102a.

Power management unit 107 may be configured to manage power delivery to some or all of the functional blocks included in SoC 100. Power management unit 107 may include sub-blocks for managing multiple power supplies for various functional blocks. In various embodiments, the power supplies may be located in analog/mixed-signal block 103, in power management unit 107, in other blocks within SoC 100, or come from external to SoC 100, coupled through power supply pins. Power management unit 107 may receive signals that indicate the operational state of one or more functional blocks. In response to the operational state of a functional block, power management unit may adjust an output of a power supply. Power management unit 107 may also receive one or mode clock signals for use in managing and adjusting an output of a power supply.

It is noted that the SoC illustrated in FIG. 1 is merely an example. In other embodiments, different functional blocks and different configurations of functions blocks may be possible dependent upon the specific application for which the SoC is intended. It is further noted that the various functional blocks illustrated in SoC 100 may operate at different clock frequencies, and may require different power supply voltage levels.

Figure 2:
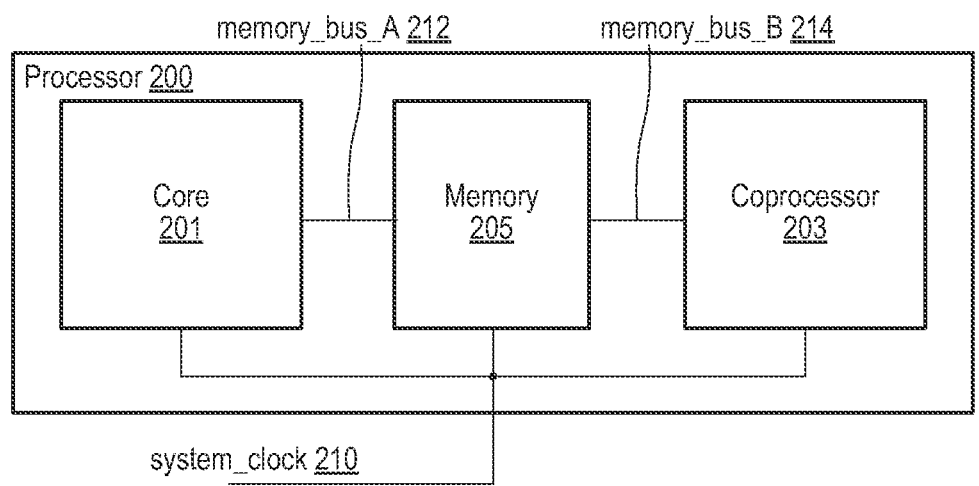
FIG. 2 illustrates an embodiment of a processor.

Turning to FIG. 2, a block diagram of an embodiment of a processor is illustrated. Processor 200 may, in some embodiments, correspond to processor 101 as illustrated in FIG. 1. Processor 200 may include core 201 and coprocessor 203, and both may be coupled to memory 205. System_clock 210 may provide a clock source to core 201, coprocessor 203 and memory 205. Memory_bus_A 212 may couple core 201 to memory 205 and memory_bus_B 214 may couple coprocessor 203 to memory 205.

Core 201 may be a general purpose core utilizing an ISA as described above in regards to processor 101 in FIG. 1. Core 201, in various embodiments, may be a single main CPU core or one core in a multi-core processor. During operation, core 201 may read and/or write data to memory 205 via memory_bus_A 212.

Coprocessor 203 may also be a general purpose core used to support various operations of core 201. In other embodiments, coprocessor 203 may be a function-specific coprocessor designed to off-load certain tasks from core 201. For example, coprocessor 203 may be a floating point execution unit, an encryption/decryption acceleration unit, a graphics acceleration unit, or any other similar coprocessing unit. Coprocessor 203 may share memory 205 with core 201, reading and/or writing data to memory 205 through memory_bus_B 214.

Memory 205 may correspond to core memory 105 in FIG. 1, and may be designed such that memory_bus_A 212 and memory_bus_B 214 may each have a port assigned for accepting write commands on a same cycle of system_clock 210. This may allow core 201 and coprocessor 203 to write to memory 205 in a same system_clock 210 cycle without having to arbitrate which of the two write commands is accepted and/or having to buffer the other write command. Memory 205 may, in some embodiments, support read commands from memory_bus_A 212 and memory_bus_B 214 in a same cycle of system_clock 210.

It is noted that processor 200 in FIG. 2 is an example intended to demonstrate concepts disclosed herein. To improve clarity, other features that may be included in a processor have been omitted in the diagram illustrated in FIG. 2. In other embodiments, any number of other functional blocks may be included.

Figure 3:
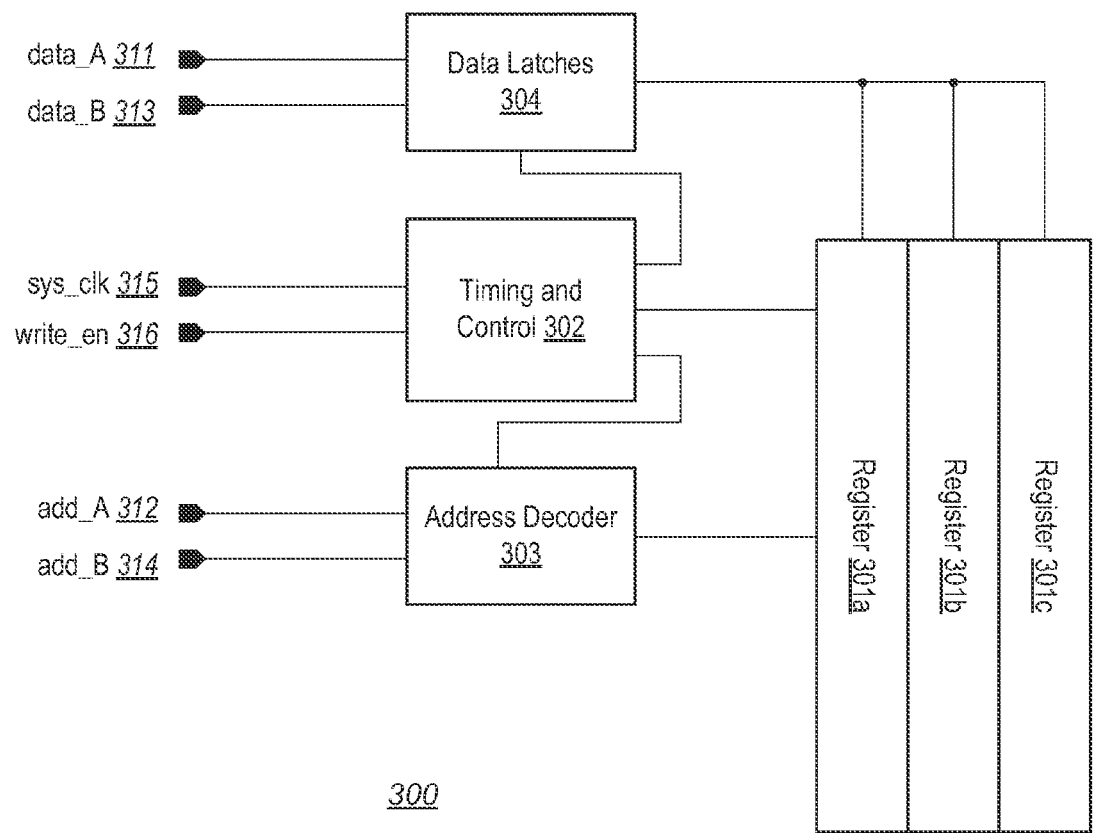
FIG. 3 illustrates an embodiment of a register file.

Moving to FIG. 3, a block diagram of an embodiment of a dual-port, double pumped memory is illustrated. Memory 300 may correspond to memory 205 in FIG. 2. Memory 300 may include registers 301a-301c for storing data. Registers 301a-301c may be coupled to timing and control unit 302, address decoder 303, and data latches 304. Timing and control 302 may also be coupled to address decoder 303 and data latches 304, and may receive a system clock signal, sys_clk 315, and one or more command signals, write_en 316. Data latches 304 may receive data corresponding to a write command through data ports, data_A 311 and data_B 313.

Address decoder 303 may receive addresses corresponding to the write commands through address ports, add_A 312 and add_B 314.

Data_A 311 and add_A 312 may be coupled to a core, such as core 201, through memory_bus_A 212 in FIG. 2. Similarly, data_B 313 and add_B 314 may be coupled to a different block, such as coprocessor 203, through memory_bus_B 214. By having two ports, memory 300 may be able to receive two write commands, one from core 201 and one from coprocessor 203 in a same cycle of sys_clk 315. Data from the write commands received through data ports data_A 311 and data_B 313 may be latched in data latches 304.

Timing and control 302 may initiate a write command process dependent upon receiving a write command on write_en 316. In some embodiments, a write command may consist of receiving new data and/or address values on any of data A 311, data B 313, add_A 312, or add_B 314 and receiving a write assertion on write_en 316. A write assertion may correspond to either a high level or low level on write_en 316, depending upon the design of memory 300. Timing and control 302 may, in response to initiating a write command, generate additional clock signals from sys_clk 315. In some embodiments, one or more clock doubler circuits may be used to create a clock signal capable of supporting two write commands in a single cycle of sys_clk 315. Timing and control 302 may also generate control signals to data latches 304 and address decoder 303

Address decoder 303 may, dependent on a signal from timing and control 302, select either add_A 312 or add_B 314 and begin to decode the received address to determine which register 301 is the target for the write command. At a same time, data latches 304 may, dependent on another signal from timing and control 302, select the associated data, either data_A 311 or data_B 313. Once the selected address, for example, add_A 312, has been decoded, the respective data_A 311 may be written to the target register 301, for example, register 301b. The write of data_A 311 to register 301b may occur in a first half of a given cycle of sys_clk 315.

During the second half of the given cycle of sys_clk 315, timing and control may signal address decoder 303 to begin decoding the other address, add_B 314, and data latches 304 to select data_B 313. When address decoder 303 finishes decoding add_B 314, data_B 313 may be written to the determined target location, for example register 301c.

It is noted that some terms commonly used in reference to SoC designs and CMOS circuits are used in this disclosure. For the sake of clarity, it is noted that "high" or "high level" refers to a voltage sufficiently large to turn on a n-channel metal-oxide semiconductor field-effect transistor (MOSFET) and turn off a p-channel MOSFET while "low" or "low level" refers to a voltage that is sufficiently small enough to do the opposite. In other embodiments, different technology may result in different voltage levels for "low" and "high."

It is also noted that the embodiment of memory 300 in FIG. 3 is merely an example for demonstrative purpose. Other functional blocks have been omitted for clarity. Although a dual-port register file is used as the example, the disclosed description may apply to any suitable multi-port, double pumped memory.

Figure 4:
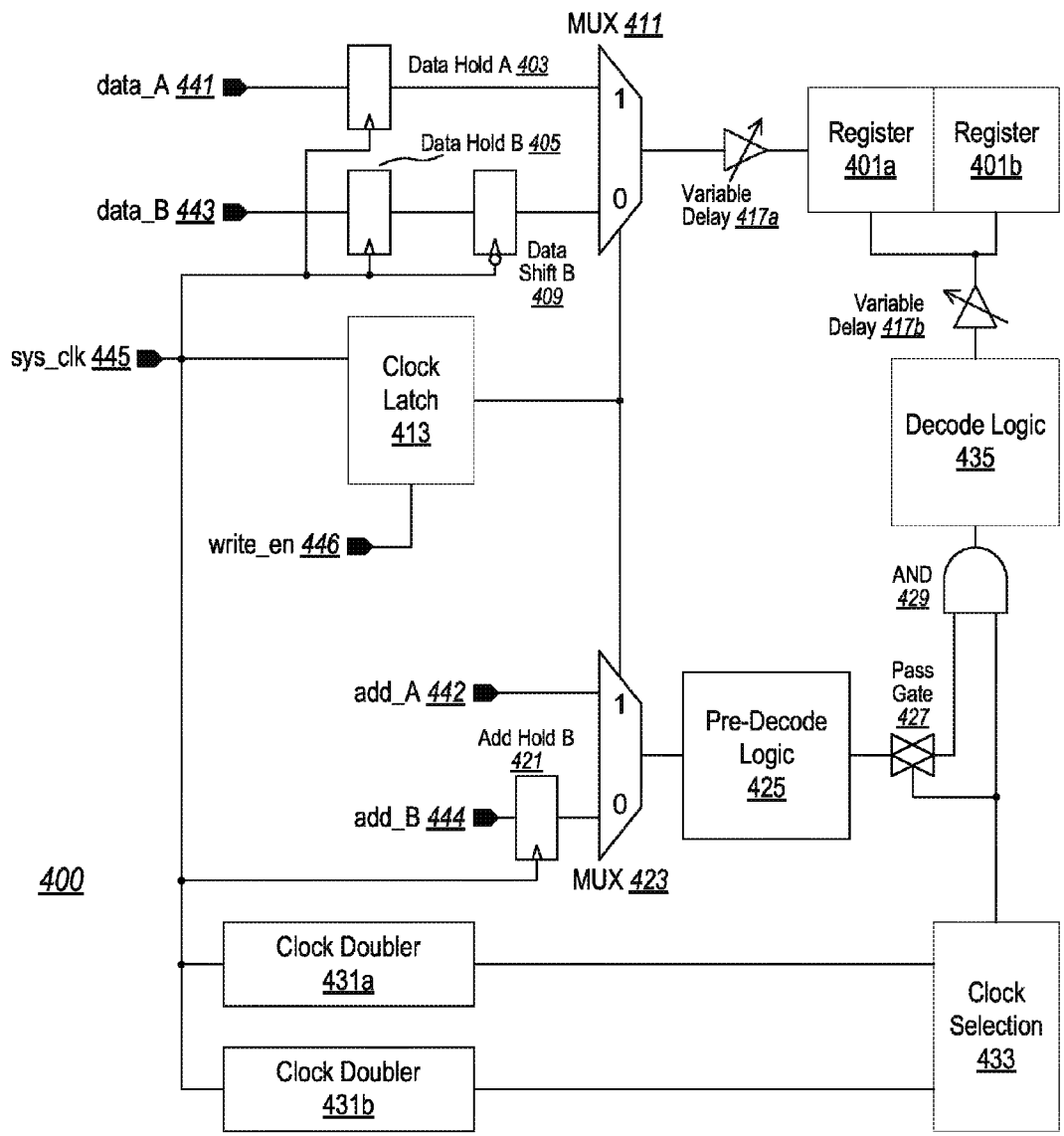
FIG. 4 illustrates a diagram of an embodiment of control circuitry for a register file.

Turning now to FIG. 4, another embodiment of a memory is illustrated. Memory 400 may correspond to two register locations and supporting write logic and control circuitry for a larger memory, such as, for example, memory 300. Memory 400 may include registers 401a and 401b, coupled to data multiplexor (MUX) 411, through variable delay 417a, and also coupled to decode logic 435 through variable delay 417b. A data path from data_A 441 and data_B 443 to registers 401 may include components such as data hold A 403, data hold B 405, and data shift B 409. An address path from add_A 442 and add_B 444 to decode logic 435 may include components such as add hold B 421, address multiplexor (MUX) 423, pre-decode logic 425, pass gate 427, AND gate 429, clock doublers 431a and 431b, and clock selection circuit 433. MUX 411 and MUX 423 may be coupled to an output of clock latch 413, which may receive and latch rising and falling edges of system clock signal (sys_clk) 445.

The process for writing data to registers 401 may be similar to the process described in regards to memory 300 of FIG. 3. A write command may be received through write_en 446 in conjunction with new values written to any one or more of data_A 441, add_A 442, data_B 443, and add_B 444. Register 401a may correspond to a single data word at a respective address, such as add_A 442, in a larger memory array. Likewise, register 401b may correspond to a single data word at an address such as add_B 444.

A command to write data_A 441 to add_A 442 in memory 400 may be requested by core 201 while, in a same sys_clk 445 cycle, a command to write data_B 443 to add_B 444 in memory 400 may be requested by coprocessor 203. Data hold A 403 and data hold B 405 may sample and hold the values of data_A 441 and data_B 443 in response to a rising edge of sys_clk 445. Also in response to the rising edge of sys_clk 445, add hold B may sample and hold the value of add_B 444. In other embodiments, a falling edge may be used in place of the rising edge. As part of the write commands, write_en 446 may be asserted, which may activate clock latch 413 to start latching values of sys_clk 445 in response to alternating rising and falling edges of sys_clk 445. In some embodiments, MUX 411 may select the output of data hold A 403 and MUX 423 may select add_A 442 in response to a rising edge on the output of clock latch 413. In other embodiments, data hold A 403 and add_A 442 may be selected in response to a falling edge on the output of clock latch 413.

Clock doublers 431a and 431b may receive system clock 445 and may create respective clock signals, each operating with a frequency twice as fast as a frequency of sys_clk 445, such that a first rising edge on each output of clock doublers 431 may correspond to a rising edge of sys_clk 445 and a second consecutive rising edge on each output may correspond to a falling edge of sys_clk 445. Clock doubler 431a may include different circuitry than what is included in clock doubler 431b. Due to the different circuits used to double the frequency of sys_clk 445, clock doubler 431a may output a different waveform than clock doubler 431b under certain operating conditions. For example, changes in operating voltage, operating temperature, or even part-to-part variations during manufacturing may result in differences between the outputs of clock doubler 431a and clock doubler 431b.

Clock selection 433 may include circuits to select one of the outputs of clock doublers 431a and 431b. Through device evaluation and characterization, the differences between the outputs of the clock doublers 431a and 431b may be understood well enough to design clock selection 433 to select between the two outputs dependent on one or more current operational parameters. Operational parameters may include a current power supply voltage level, a current temperature reading, a current frequency of sys_clk 445, a current activity level of SoC 100 or results from a manufacturing test procedure performed on a system including SoC 100 and stored in an accessible memory.

The value of add_A 442 may pass through MUX 423 into pre-decode logic 425 during the first half of the latched value of sys_clk 445. Pre-decode logic 425 may begin a process of determining the memory location corresponding to the value of add_A 442. The output of the selected clock doubler 431 may be used to gate an output of pre-decode logic 425 into decode logic 435 using pass gate 427 and AND gate 429. Decode logic 435 may receive the output of pre-decode logic 425 while the selected clock doubler output is high. In other embodiments, logic may be modified such that decode logic 435 may receive the output of pre-decode logic 425 while the selected clock doubler output is low. The output of decode logic 435 may select the register location corresponding to add_A 442, for example, register 401*a*. Since MUX 411 may be selecting the output of data hold A 403, the value of data_A 441 may be written to register 401*a* upon the selection of register 401*a* by decode logic 435.

The value of data_A 441, however, may pass through variable delay 417*a*, and the value of add_A 442 may pass through variable delay 417*b* before being received by register 401*a*. Propagation delays through the circuits that the value of add_A 442 must pass through before decode logic 435 may decode the address and select register 401*a* may require adjusting the timing of the arrival of the value of data_A 441 at register 401*a* if add_A 442 where to arrive late. Conversely, the circuits that data_A 441 must pass through could cause data_A 441 to arrive late, requiring adjusting the timing of add_A 442. Device evaluation and characterization, as previously disclosed, may allow for an estimation of the propagation delays under various operating conditions. Variable delays 417*a* and 417B may, therefore, be set dependent on similar operational parameters as used to select between the clock doublers 431.

On a falling edge of sys_clk 445, the value of data_B 443 maybe sampled from the output of data hold B 405 into data shift B 409. The same falling edge of sys_clk 445 may be latched in clock latch 413 and then output to MUX 411 and MUX 423. In response to the falling edge of the latched sys_clk 445, MUX 411 may switch to the value of data_B 443 just sampled into data shift B 409, and MUX 423 may switch to the value of add_B 444 being held in add hold B 421. Pre-decode logic 425 may begin the decode of add_B 444 and on a next rising edge of the output of the selected clock doubler 431, the partially decoded value of add_B 444 may be passed to decode logic 435. Decode logic 435 may complete decoding the value of add_B 444, pass through variable delay 417*b*, and select the corresponding register, i.e., register 401*b*. Meanwhile, the value of data_B 443 may pass through MUX 411, then through variable delay 417*a* to coincide with the selection of register 401*b* by decode logic 435, at which time the value of data_B 443 may be written to register 401*b*. As with data_A 441 and add_A 442, variable delays 417*a* and 417*b* may be adjusted such that the arrivals of data_B 443 and add_B 444 coincide correctly.

It is noted that memory 400 of FIG. 4 is merely an example. Variations in the design and features of memory 400 are contemplated. For example, only two clock doubler circuits are shown. In alternate embodiments, any suitable number of clock doubler circuits may be employed. Memory 400 is shown and described to select a first data and address in response to a rising edge of sys_clk 445 and select a second data and address in response to a falling edge. In other embodiments, clock polarity may be reversed and the first data and address may be selected in response to the falling edge and the second data and address may be selected in response to the rising edge.

Figure 5:
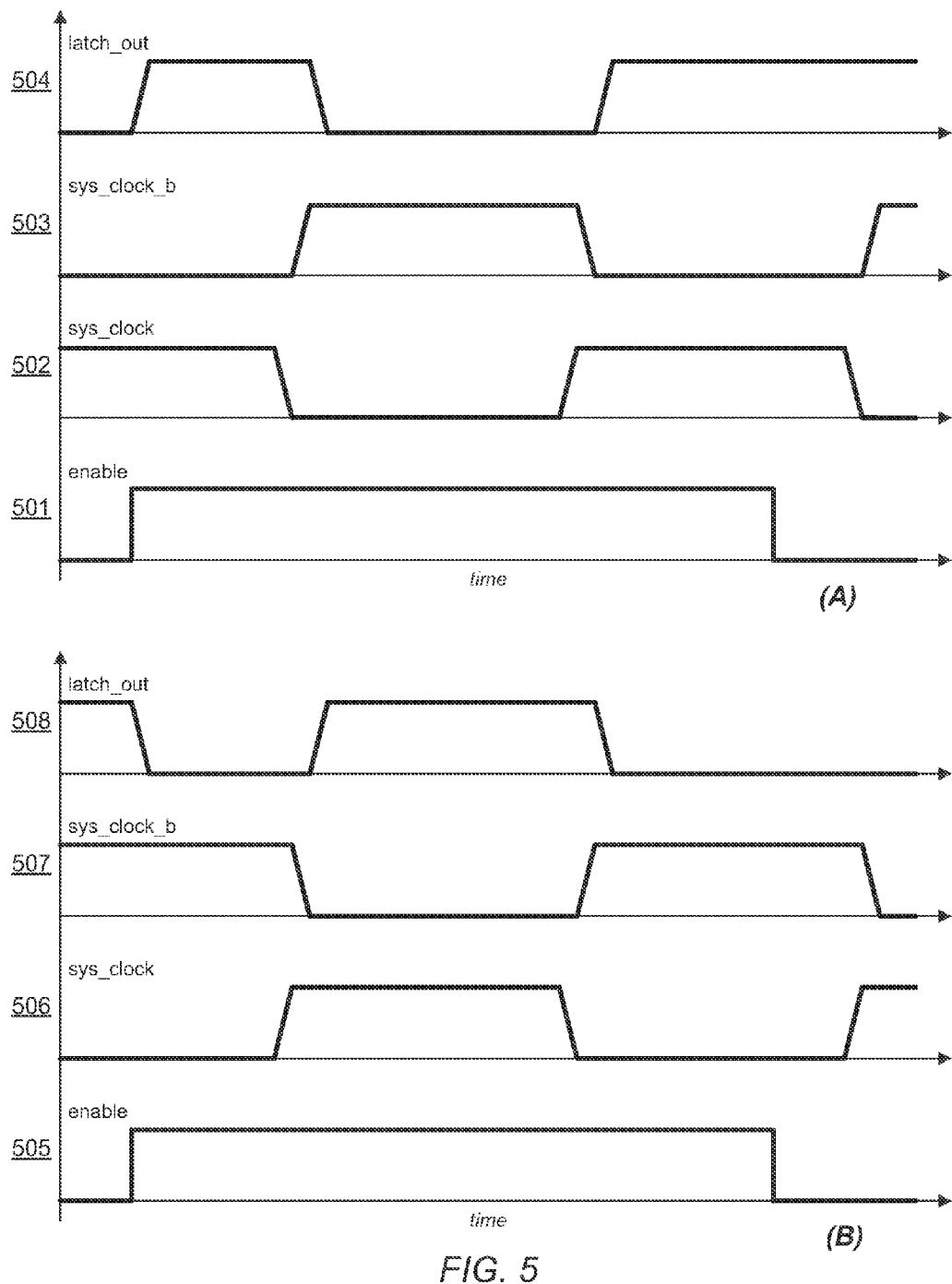
FIG. 5, which includes FIGS. 5(a) and 5(b), illustrating charts of possible waveforms associated with an embodiment of control circuitry for a register file.

Moving now to FIG. 5, illustrations of two charts of possible waveforms associated with a clock latch are presented. The two charts may correspond to an operation of a clock latch such as, for example, clock latch 413 in FIG. 4. Referring collectively to FIG. 4 and the charts of FIG. 5, each chart may include waveforms for enable 501/505 (which may correspond to write_en 446), sys_clock 502/506 (which may correspond to sys_clk 445), sys_clock_b 503/507 (the inverse of sys_clock), and latch_out 504/508 (which may correspond to an output of clock latch 413).

The chart of FIG. 5(A) may illustrate operation of clock latch 413 when enabled and disabled while sys_clock 502 is high. Before enable 501 goes high, latch_out 504 may be low (which may correspond to a previously latched value), while sys_clock 502 is high and sys_clock_b is low. When enable 501 goes high, the values of sys_clock and sys_clock_b may cause latch_out 504 to transition high. With enable 501 remaining high, sys_clock 502 may transition low. Sys_clock_b 503 may transition high after a short propagation delay from the transition of sys_clock 502. In response to the transition of both sys_clock 502 and sys_clock_b 503, latch_out 504 may transition low after a propagation delay.

Sys_clock 502 may transition back high, followed by sys_clock_b 503. Latch_out 504 may transition back high, accordingly. Enable 501 may transition low before another toggle on sys_clock 502 or sys_clock_b 503, which may leave latch_out 504 in a high state. Further transitions on sys_clock 502 and sys_clock 503 may have no effect on latch_out while enable 501 remains low.

In FIG. 5(B), the operation of clock latch 413 may be illustrated when enabled and disabled with sys_clock 506 in a low state. In this chart, latch_out 508 may be high from a previously latched value before enable 505 transitions high. At this time, sys_clock 506 and sys_clock_b 507 may be low and high, respectively. When enable 505 transitions high, latch_out 508 may respond to the current states of sys_clock 506 and sys_clock_b 507 by transitioning low. Sys_clock 506 may transition high, followed by sys_clock_b 507 transitioning low. latch_out 508 may respond by going high. While enable 505 remains high, sys_clock 506 may transition back low followed by sys_clock_b transitioning high. In response, latch_out 508 may transition low. Enable 505 may de-assert to a low state before another transition on sys_clock 506 or sys_clock_b 507. Latch_out 508 may remain in a low state while enable 505 is low, despite further transitions on sys_clock 506 and sys_clock_b 507.

It is noted that the waveforms in FIGS. 5(A) and 5(B) are merely examples for demonstration. In other embodiments, circuit design choices may result in various propagation delays and rates of transitioning between low and high states.

Figure 6:
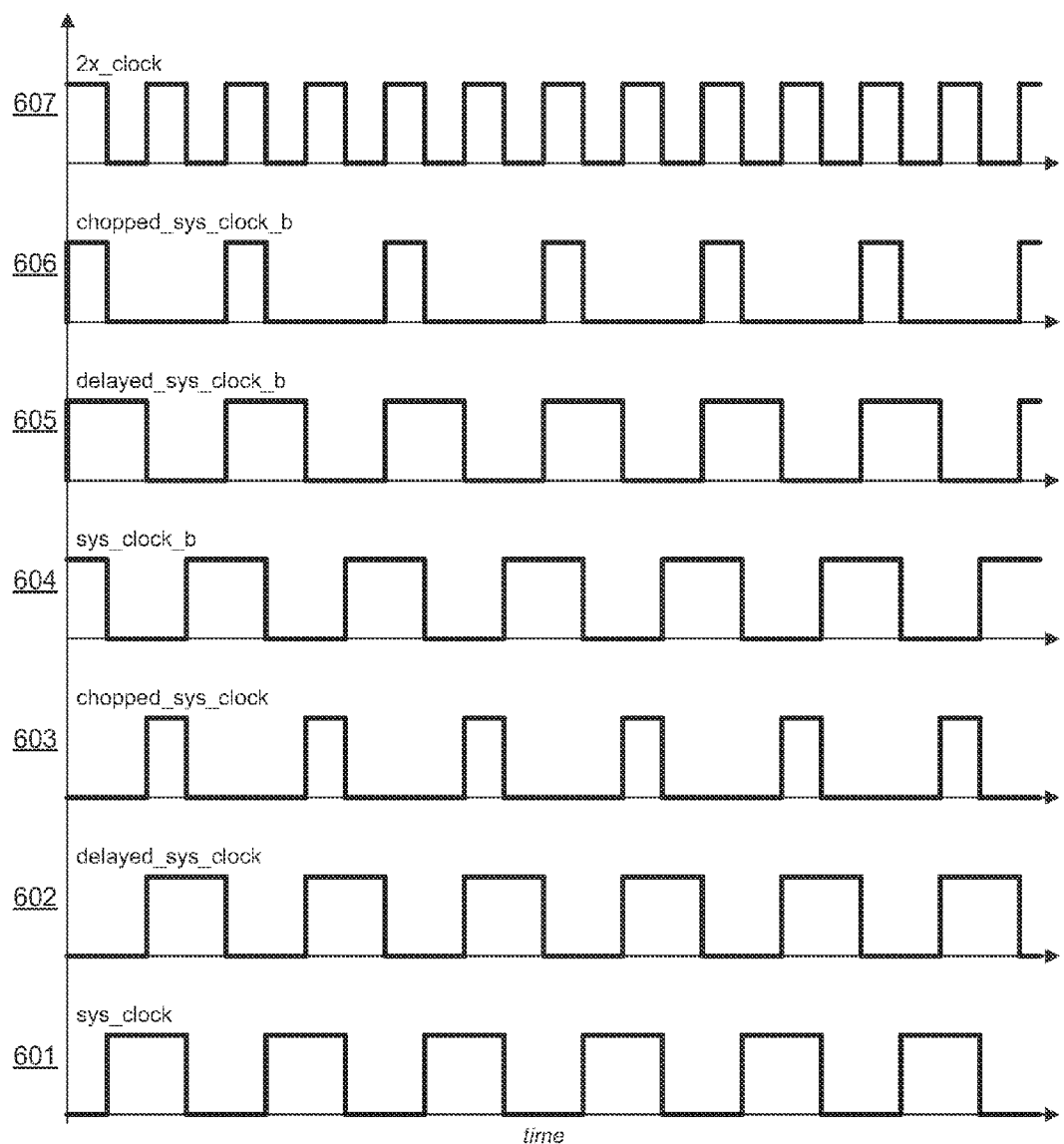
FIG. 6 illustrates another chart of possible waveforms associated with an embodiment of control circuitry for a register file.

Turning to FIG. 6, a chart of possible waveforms associated with a clock doubler circuit are presented. The chart may correspond to an operation of a clock doubler circuit such as, for example, clock doublers 431*a* or 431*b* in FIG. 4. Referring collectively to FIG. 4 and the chart of FIG. 6, each chart may include waveforms for sys_clock 601 (which may correspond to sys_clk 445), delayed_sys_clock 602, chopped_sys_clock 603, sys_clock_b 604, delayed_sys_clock_b 605, chopped_sys_clock_b 606, and 2×_clock 607.

Sys_clock 601 may be a clock signal input into clock doubler 431*a*, for example, in order to create a clock signal running at twice the frequency of sys_clock 601. Sys_clock 601 may be input into a delay circuit to create delayed_sys_clock 602. The delay may be programmable to allow adjustments to the final output, i.e., 2×_clock 607. In some embodiments, the delay may be targeted to be 25% of the period of sys_clock 601 in order to create a 50% duty cycle for 2×_clock 607, while other duty cycle targets may be used in other embodiments. Sys_clock 601 and delayed_sys_clock 602 may be combined together using a logical AND operation (also referred to herein as being "ANDed" together) to created chopped_sys_clock 603. In other embodiments, other logic gats may be used to combine Sys_clock 601 and delayed_sys_clock 602, such as, for example, a NAND gate or a NOR gate.

Sys_clock 601 may also be inverted to create sys_clock_b 604. Sys_clock_b 604 may be input into a similar delay circuit as described for sys_clock 601 to create delayed_sys_clock_b 605. Sys_clock_b 604 and delayed_sys_clock_b 605 may also be ANDed (or NORed, or NANDed) together to create chopped_sys_clock_b 606. Chopped_sys_clock 603 and chopped_sys_clock_b 606 may be ORed together to create 2×_clock 607, which may have a frequency twice that of sys_clock 607.

It is noted that the waveforms in FIG. 6 are examples to demonstrate the disclosed concepts. Implementation choices, such as manufacturing technologies and circuit designs may, in other embodiments, result in various signal delays and transition rates that may alter the appearance of the signals.

As shown in FIG. 6, 2×_clock 607 is illustrated as having an approximately 50% duty cycle, which, in some embodiments, may be desirable. To achieve close to a 50% duty cycle may require a delay circuit that is consistent over process, voltage and temperature changes or is adjustable to compensate for such changes.

Figure 7:
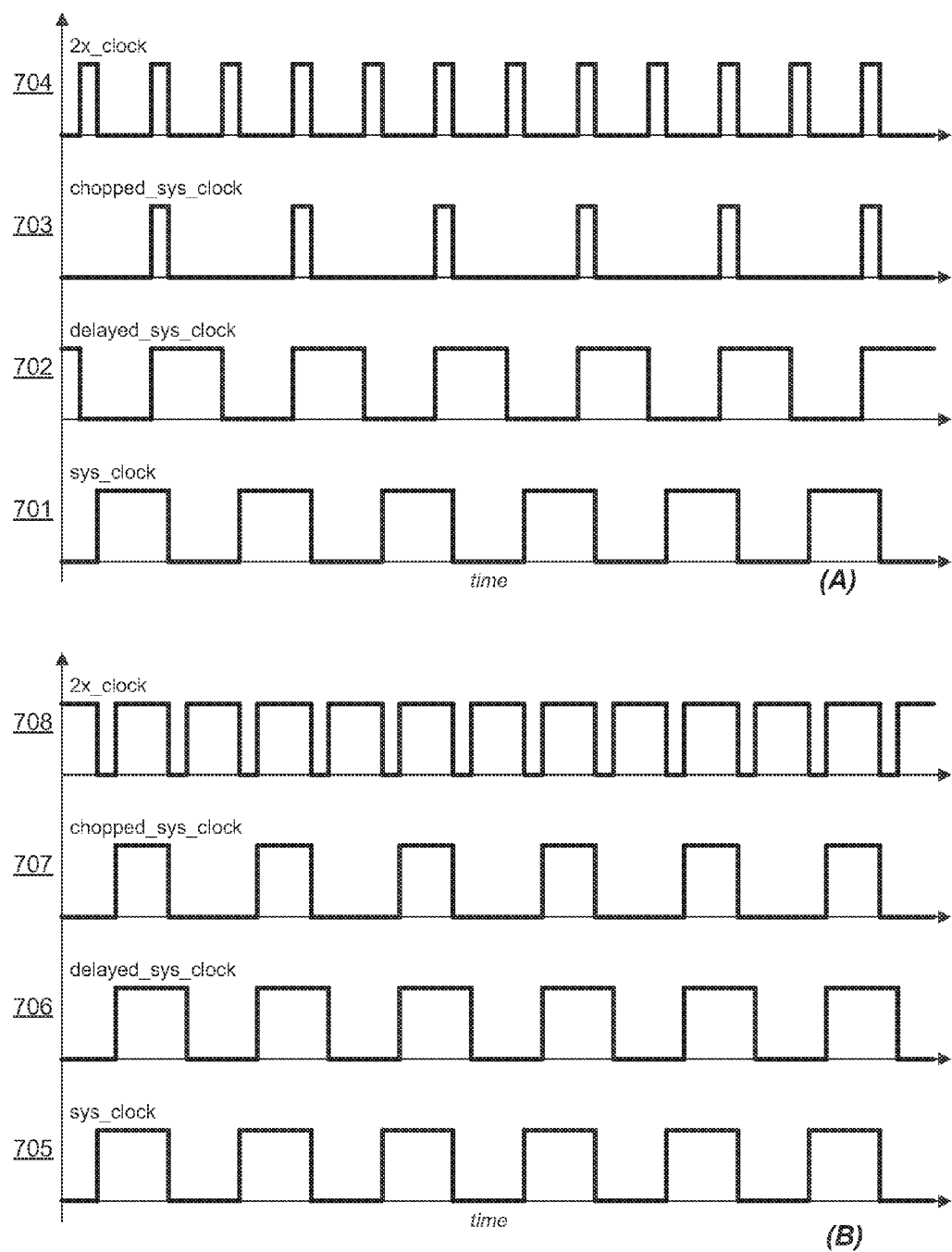
FIG. 7, which includes FIGS. 7(a) and 7(b), illustrating charts of possible waveforms associated with an embodiment of control circuitry for a register file.

Moving to FIG. 7, two charts are illustrated in FIG. 7(A) and FIG. (B), which may demonstrate the effects of changes in propagation delays to a clock doubler circuit output such as described in FIG. 6. FIG. 7(A) illustrates the effect of an increased delay between sys_clock 701 and delayed_sys_clock 702. FIG. 7(B), in contrast, shows the effect of a decreased delay between sys_clock 705 and delayed_sys_clock 706. FIGS. 7(A) and 7(B) include signals corresponding to sys_clock 601, delayed_sys_clock 602, chopped_sys_clock 603, and 2×_clock, but omit signals corresponding to sys_clock_b 604, delayed_sys_clock_b 605, and chopped_sys_clock_b 606 for the sake of brevity.

As stated above, variations in semiconductor processing, operating voltage, or operating temperature may result in variations to propagation delays in circuits. In the chart of FIG. 7(A), delayed_sys_clock 702 has a longer delay from sys_clock 701 than the comparative delayed_sys_clock 602 has from sys_clock 601. It can be seen that the resulting chopped_sys_clock 703 and, therefore, the resulting 2×_clock 704, have smaller high pulses than the corresponding chopped_sys_clock 603. The chart of FIG. 7(B) shows delayed_sys_clock 706 with a shorter delay from sys_clock 705 than the comparable delayed_sys_clock 602 has from sys_clock 601. In this instance, the resulting chopped_sys_clock 707 and, therefore, the resulting 2×_clock 708, have larger high pulses than the corresponding chopped_sys_clock 603.

As the delay between sys_clock and delayed_sys_clock increases towards 50% of the period of sys_clock, the high pulses of chopped_sys_clock and 2×_clock may approach a pulse width that is narrow enough that circuitry receiving 2×_clock may not be capable of detecting all high pulses. Missing a clock pulse may cause erroneous operation of the circuitry and may result in a system failure. Likewise, as the delay between sys_clock and delayed_sys_clock decreases towards zero delay, the low pulses of chopped_sys_clock and 2×_clock may approach a pulse width that is too narrow to be detected and may result in similar erroneous operation of the system. Maintaining a proper delay between sys_clock and delayed_sys_clock may, therefore, require programmable delay circuits to compensate for variations in semiconductor processing, operating voltage, or operating temperature.

It is noted that that the waveforms in FIGS. 7(A) and 7(B) are merely examples for demonstrative purposes. Other embodiments may employ various circuit design choices which may result in different propagation delays and rates of transitioning between low and high states.

Figure 8:
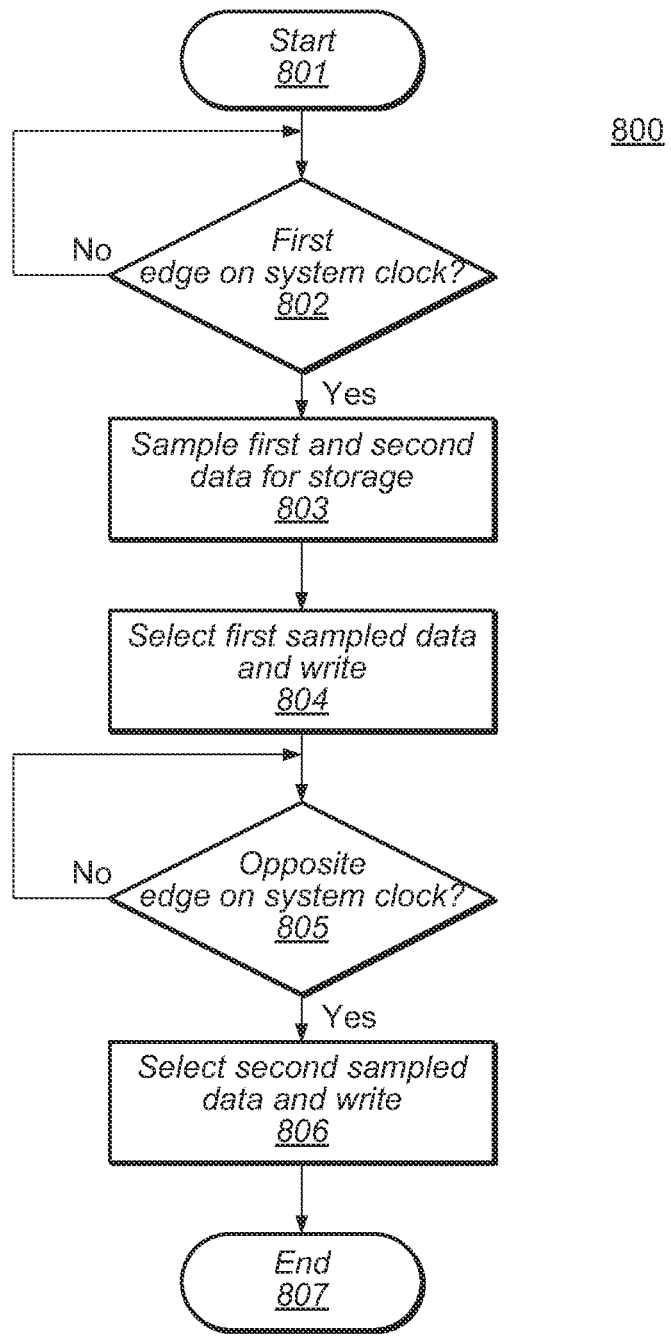
FIG. 8 illustrates a flowchart for an embodiment of a method for operating a double pumped, multi-port memory.

Turning now to FIG. 8, a flowchart for an embodiment of a method for operating a double pumped, multi-port memory is illustrated. Method 800 may be operable on a memory such as memory 400 in FIG. 4. Referring collectively to FIG. 4 and the flowchart of FIG. 8, the method may begin in block 801.

The method may depend on detecting a first edge of a received clock signal (block 802). Memory 400 may receive a system clock such as, for example, sys_clk 445. Memory 400 may sample or capture a first edge of sys_clk 445 using clock latch 413. As referred to herein, a "first" edge may correspond to either a rising edge of sys_clk 445, or a falling edge of sys_clk 445, depending on the design of the circuits. Clock latch 413 may also receive an enable signal, such as, e.g., write_en 446, which may be used as a clock gate for sys_clk 445. In such an embodiment, clock latch 413 may only sample sys_clk 445 when write_en 446 is asserted for a write operation to memory 400. If the first edge is not detected, the method may remain in bloc 802. Otherwise, if a first edge is detected and sampled, then the method may move to block 803 to sample data.

In response to the first edge of sys_clk 445, at least two data values may be sampled (block 803). Data values, such as data_A 441 and data_B 443 may be sampled and held in data hold A 403 and data hold B 405, respectively, on the first edge of sys_clk 445. Other embodiments may sample more than two data values in response to the first edge.

Data_A 441 may be selected on a first edge on the output of clock latch 413 (block 804). A first edge on the output clock latch 413 may indicate a write command has been received and data_A 441 may be selected for a first write to a location in memory 400, such as, e.g., register 401*a*. Data_A 441 may be selected by MUX 411 dependent on a high output of clock latch 413. The selected output of MUX 411 may be written to register 401*a*.

The method may now depend on detecting an opposite edge of sys_clk 445 (block 805). As referred to herein, an "opposite" clock edge may refer to a clock edge that is of an opposite polarity to the previous clock edge, i.e, a falling edge after a rising edge or a rising edge after a falling edge. Clock latch 413 may sample sys_clk 445 in response to the opposite edge. In addition, data_B 443 may be sampled into data shift B 409. This additional sampling of data_B 443 into data shift B 409 may allow data_B 443 to be held past the next edge of sys_clk 445, even if a subsequent data value is sampled into data hold B 405 on this next edge. If an opposite edge is not detected, then the method may remain in block 805. Otherwise, the method may transition to block 806 to write data_B 443.

In response to an opposite edge on the output of clock latch 413, data_B 443 may be selected and written to memory 400 (block 806). The transition to a low output from clock latch 413, may cause MUX 411 to switch from data_A 441 on the output of data hold A 403 to data_B 443 on the output of data shift B 409. Data_B 443 may be written to a location in memory 400, such as, for example, register 401*b*. The method may end in block 807 with the completion of the write of data_B 443 to register 401*b*.

It is noted that method 800 of FIG. 8 depicts operations being performed in a sequential fashion. In various other embodiments, some operations may be performed in parallel or in a different sequence. Additional blocks may be included in other embodiments.

Figure 9:
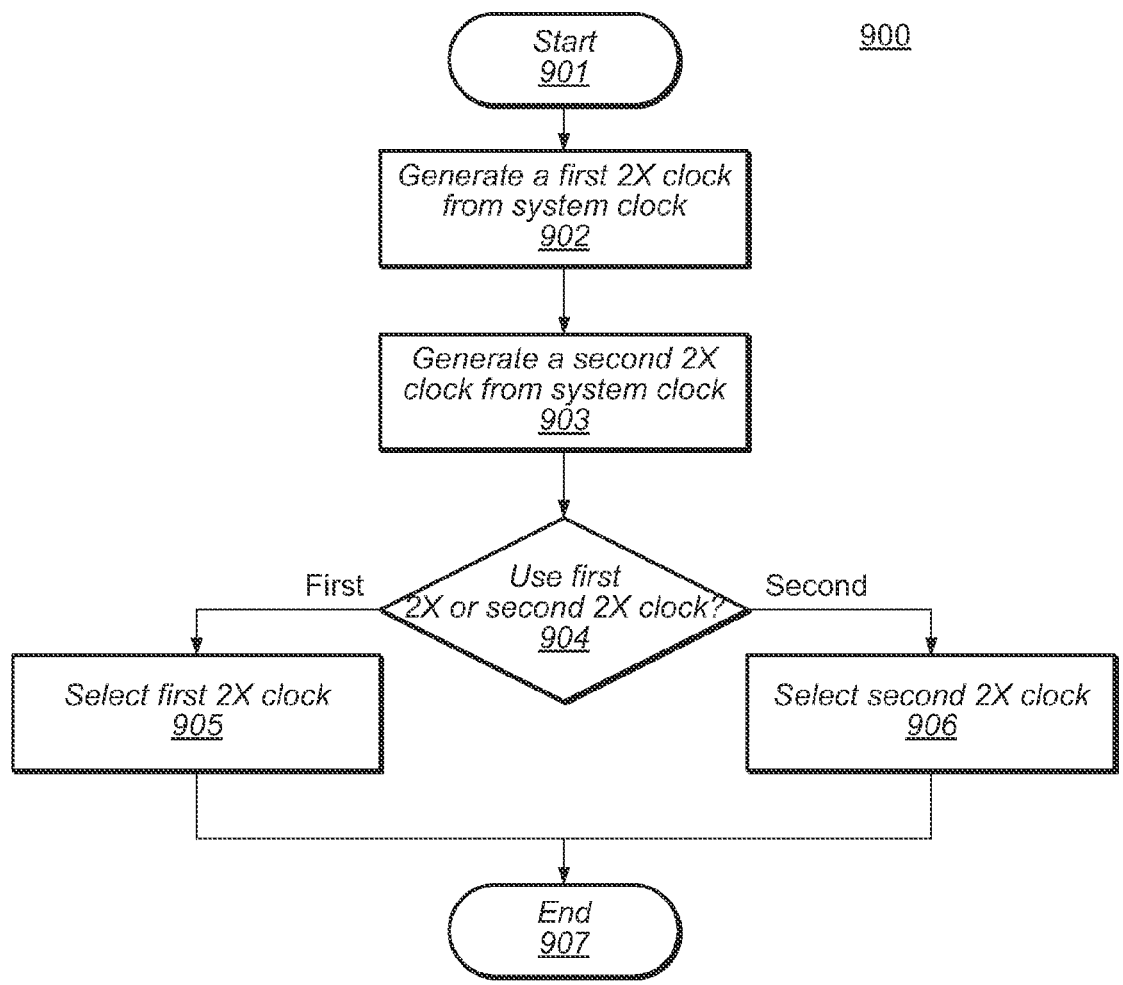
FIG. 9 illustrates a flowchart of a an embodiment of a method for generating a clock signal in a memory.

Moving now to FIG. 9, a flowchart of a method for generating a clock signal in an embodiment of a memory is illustrated. Method 900 may be operable on a memory such as memory 400 in FIG. 4 in order to generate a double-rate clock signal from a system clock signal. Referring collectively to FIG. 4 and the flowchart of FIG. 9, the method may begin in block 901.

A first clock signal may be generated with a frequency twice the frequency of an input clock signal (block 902). A clock signal such as sys_clk 445 may be received by a clock doubler circuit such as, for example, clock doubler 431a. Clock doubler 431a may output a double-rate clock signal, i.e., a clock signal with a frequency twice the frequency of sys_clk 445, using a circuit such as, for example, a clock chopper circuit.

A second clock signal may be generated with a frequency twice the frequency of an input clock signal (block 903). Sys_clk 445 may be received by another clock doubler circuit such as, for example, clock doubler 431b. Clock doubler 431b may also output a double-rate clock signal with a frequency twice the frequency of sys_clk 445 using a circuit such as, for example, a pulsed clock generator.

Method 900 may depend on a decision to select the output of clock doubler 431a or clock doubler 431b (block 904). As previously stated, variations in semiconductor processing, operating voltage, or operating temperature may result in variations to propagation delays in circuits. Such variations in the propagation delays may alter the output signals of clock doubler circuits 431a and/or 431b. For example, duty cycles of either output signal may resemble the waveforms of FIG. 7(A) or 7(B). Other signal degradations may be present on either output signal. Circuitry, such as clock selection 433 for example, may select either the output of clock doubler 431a or the output of clock doubler 431b dependent on one or more operational parameters. Operational parameters may include manufacturing test data stored in non-volatile memory accessible by SoC 100, a current operating voltage level, and a current operating temperature. If the output of clock doubler 431a is selected, the method may move to block 905. Otherwise, the method may move to block 906.

Dependent on operational parameters, the output of clock doubler 431a may be selected (block 905). The circuitry used by clock doubler 431a may output a more desirable clock signal than clock doubler 431b under current operational parameters. The more desirable signal may correspond to a desired duty cycle or a phase shift between edges of the output of clock doubler 431a and the edges of sys_clk 445. The method may end in block 907.

The output of clock doubler 431b may be selected instead dependent on the current operational parameters (block 906). Current operational parameters may indicate that clock doubler 431b may be expected to output a more desirable clock signal than clock doubler 431a. The method of generating the output signal may be more favorable for clock doubler 431b under certain conditions. The method may end in block 907.

It is noted that method 900 of FIG. 9 is merely an example. In various other embodiments, more or fewer operations may be included. In some embodiments, operations may be performed in a different sequence.

Figure 10:
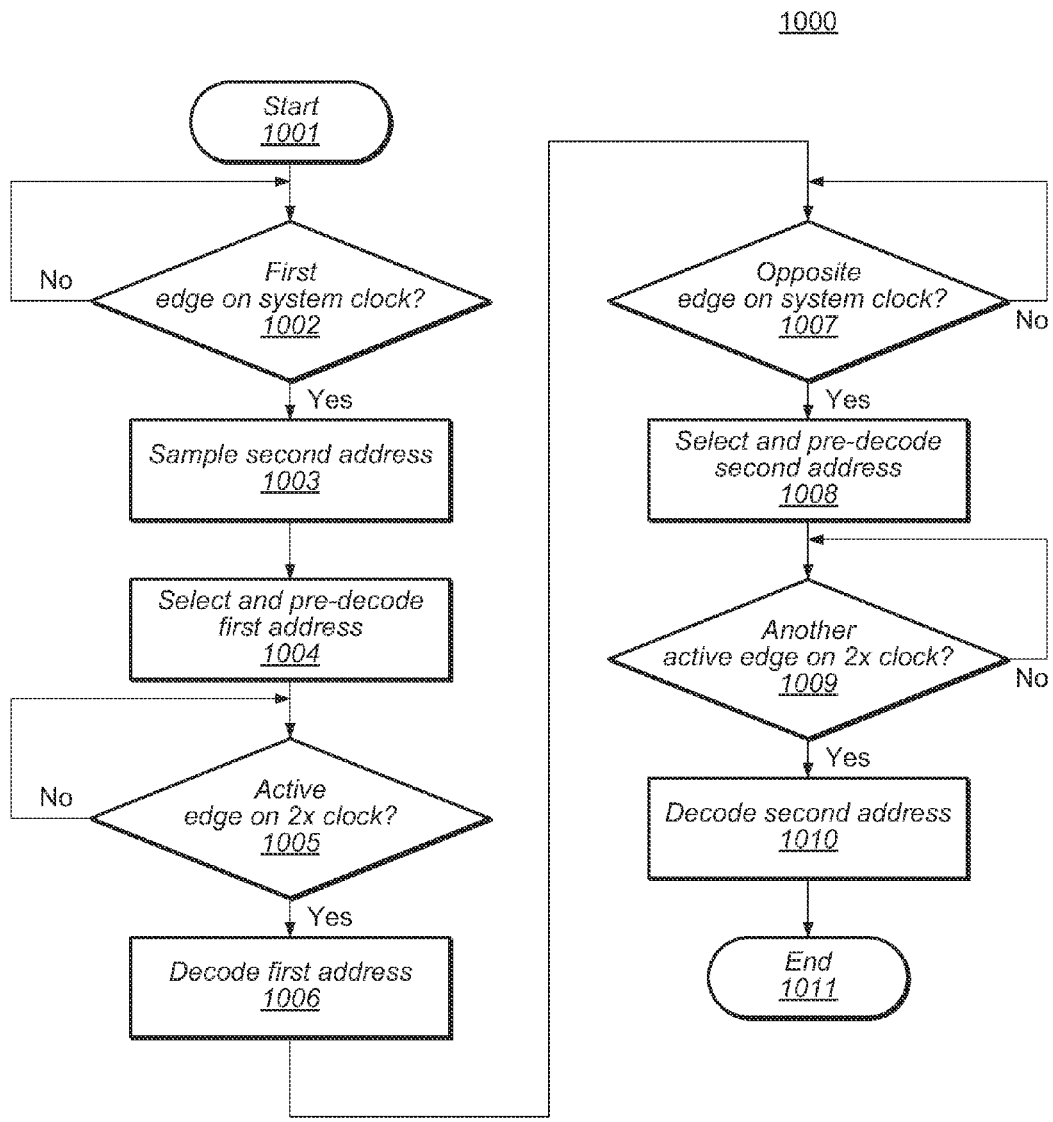
FIG. 10 illustrates a flowchart of an embodiment of a method for decoding two addresses for a double pumped, multi-port memory.

Turning to FIG. 10, a method for decoding two addresses for an embodiment of a double pumped, multi-port memory is illustrated. Method 1000 may be applied to a memory such as, for example, memory 400 in FIG. 4. Referring collectively to FIG. 4 and the flowchart of FIG. 10, the method may begin in block 1001.

The method may depend on a state of a system clock (block 1002). Circuitry in memory 400 may wait for a first edge on sys_clk 445. As previously stated, a "first" edge may correspond to either a rising edge of sys_clk 445, or a falling edge of sys_clk 445. In response to a first edge on sys_clk 445, clock latch 413 may sample sys_clk 445. Clock latch 413 may also output the sampled sys_clk 445 to be used as an input to MUX 423. Clock latch 413 may also, in some embodiments, be further enabled by an enable signal, such as, for example, write_en 446. If a first edge is not detected on sys_clk 445, then the method may remain in block 1002. Otherwise, the method may sample an address in block 1003.

An address may be sampled in response to a first edge of sys_clk 445 (block 1003). For example, applying method 1000 to memory 400, add_B 444 may be sampled by add hold B 421 on a first edge of sys_clk 445. Add_B 444 may be sampled and held for later use while another address is acted upon.

Add_A 442 may be selected and pre-decoded (block 1004). Add_A 442 may be selected by MUX 423, responsive to the first edge of the sampled sys_clk 445 from clock latch 413. The output of MUX 423 may be received by pre-decode logic 425 to begin an address decoding process. Pre-decode logic 425 may, in some embodiments, decode one or more most-significant bits of add_A 442. In other embodiments, other bits of add_A 442 may be masked-off as part of the pre-decode process.

The method may depend on a state of a double-rate clock signal (block 1005). As described above in regards to method 900 of FIG. 9, a double-rate clock signal may be generated from sys_clk 445, by clock doublers 431a and 431b. One of these double-rate clock signals may be selected by clock selection 433. The selected double-rate clock signal may be monitored to detect an active edge. In various embodiments, the active edge may be a rising edge or a falling edge of the double-rate clock signal. In some embodiments, an active edge may include both rising and falling edges. If an active edge is not detected on the selected double-rate clock signal, then the method may remain in block 1005. Otherwise, the method may move to block 1006 to decode add_A 442.

The pre-decoded address generated from add_A 442 may be further decoded in response to an active edge detected on the selected double-rate clock signal (block 1006). The pre-decoded output from pre-decode logic 425 may be received by decode logic 435 in response to the detection of the active edge. Decode logic 435 may receive the pre-decoded add_A 442 and complete the address decoding process. Upon completion of the decoding process, the indicated memory location may be selected for a write operation associated with add_A 442. For example, register 401a may be the memory location identified by add_A 442 and may receive the data, e.g., data_A 441, associated with add_A 442.

The method may now depend again on a state of sys_clk 445 (block 1007). An opposite edge on sys_clk 445 may indicate a time to complete the write operation to add_A 442. Clock latch 413 may sample sys_clk 445 in response to detecting the opposite edge of sys_clk 445. A second write operation may begin in response to sampling the opposite edge on sys_clk 445. If the opposite edge is not detected, the method may remain in block 1007. Otherwise, the method may begin operating on add_B 444 in block 1008.

Add_B 444 may be selected and pre-decoded (block 1008). An opposite edge on the output of clock latch 413 may cause MUX 423 to switch to the sampled and held add_B 444 from add hold B 421. Add_B 444 may be received by pre-decode logic 425. As was done for add_A 442 in block 1004, pre-decode logic 425 may process add_B 444 to prepare the address for decode logic 435.

The method may again depend on a state of the selected double-rate clock signal (block 1009). A second consecutive active edge on the selected double-rate clock signal may be detected. The active edge and subsequent voltage level of the double-rate clock signal may enable pass gate 427 and AND gate 429. If a consecutive active edge is not detected, then the method may remain in block 1009. Otherwise, the method may move to block 1010 to decode add_B 444.

Upon detecting the next active edge on the double-rate clock signal, the pre-decoded output from pre-decode logic 425 may be received by decode logic 435 (block 1010). As was described for add_A 442 in block 1006, the memory location indicated by add_B 444 may be fully decoded and the memory location, e.g., register 401b, may be selected for the next write operation, such as to received data_B 443 for example. The method may end in block 1011.

It is noted that method 1000 of FIG. 10 is an example for demonstration. In various other embodiments, more or fewer operations may be included. In some embodiments, some operations may be performed in parallel and/or in a different order.

Figure 11:
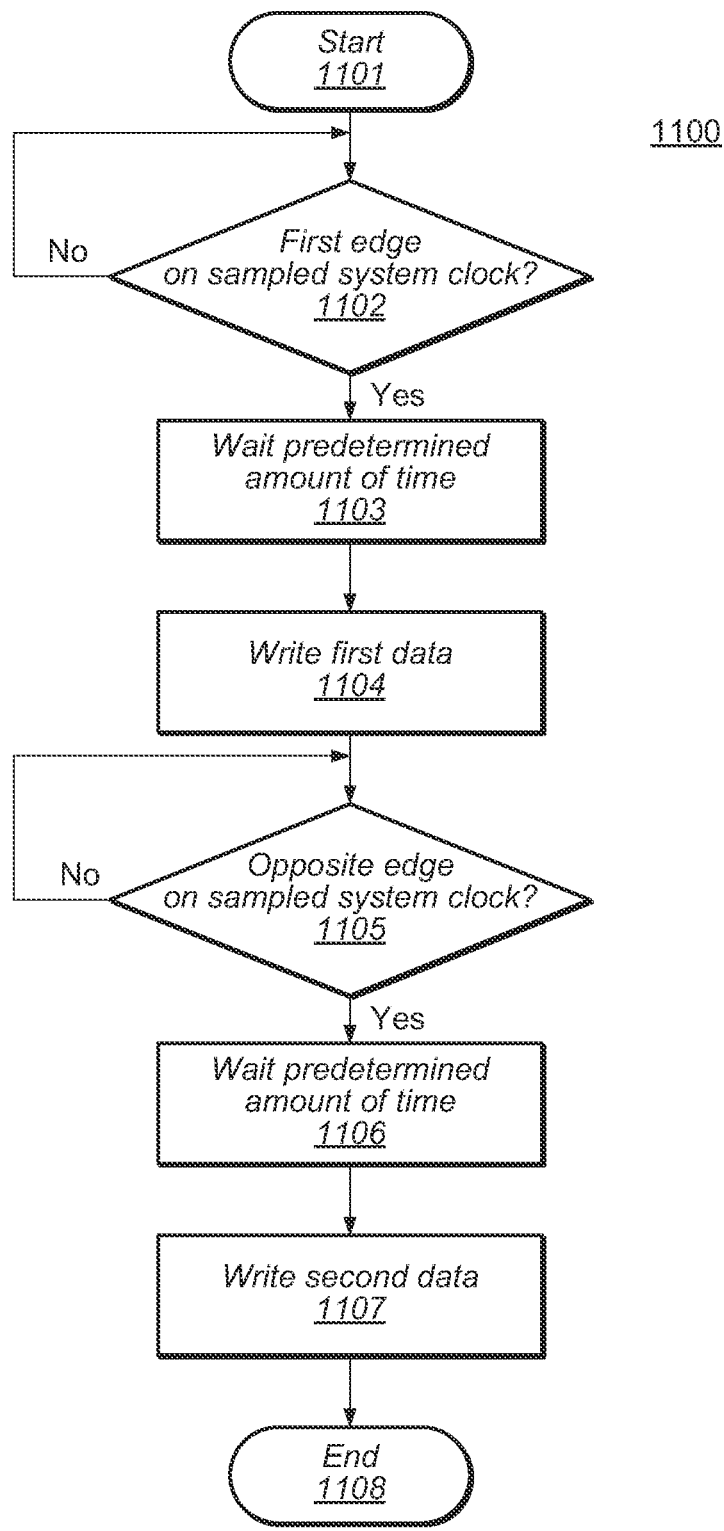
FIG. 11 illustrates a flowchart of an embodiment of a method for writing data in a double pumped, multi-port memory.

Moving now to FIG. 11, a method for writing data in an embodiment of a double pumped, multi-port memory is illustrated. Method 1100 may be applied to a memory such as, for example, memory 400 in FIG. 4. Referring collectively to FIG. 4 and the flowchart of FIG. 11, the method may begin in block 1101.

The method may depend on a state of a system clock (block 1102). Clock latch 413 in memory 400 may wait for a first edge on sys_clk 445. As previously stated, a "first" edge may correspond to either a rising edge of sys_clk 445, or a falling edge of sys_clk 445. In response to a first edge on sys_clk 445, clock latch 413 may sample sys_clk 445. MUX 411 may receive the output of clock latch 413 to use to select one of two inputs. Clock latch 413 may also, in some embodiments, be further enabled by an enable signal, such as, for example, write_en 446. If a first edge is not detected on sys_clk 445, then the method may remain in block 1102. Otherwise, the method may enter a wait time in block 1103.

Variable delay 417a and/or variable delay 417b may cause a delay for a predetermined amount of time (block 1103). MUX 411 may select a first data value, e.g., data_A 441, in response to the first edge of the sampled sys_clk 445 received from clock latch 413. The output of MUX 411 (i.e., data_A 441) and/or the output of decode logic 435 (i.e., add_A 442) may be delayed through variable delay 417a and/or 417b. Variable delays 417a and 417b may be programmed to delay signals passing through by a predetermined amount of time. The amount of time for the delay may be selected to time the arrival of data_A 441 to a selected register 401 with the arrival of add_A 442 from decode logic 435 to select the intended target register 401. The amount of time for the delay may depend upon one or more operational parameters which may be indicative of current propagation delays through the circuits of memory 400. As previously described in regards to FIG. 4, operational parameters may include a current power supply voltage level, a current temperature reading, a current frequency of sys_clk 445, a current activity level of SoC 100 in FIG. 1 or results from a manufacturing test procedure performed on a system including SoC 100 and stored in an accessible memory.

Data_A 441 may be written to register 401a (block 1104). After passing through variable delay 417a, data_A 441 may be aligned with a decoded address based on add_A 442. Add_A 442 may be decoded, pass through variable delay 417b, and register 401a may be selected in accordance with a process such as described by method 1000 in FIG. 10. Variable delays 417a and 417b may be adjusted to time the arrival of data_A 441 at register 401 at time sufficient for register 401a to have been selected and allowing for enough time for the write operation to complete before a next write operation results in a new register 401 being selected.

The method may again depend on a state of sys_clk 445 (block 1105). In particular, an opposite edge of the sampled sys_clk 445 output from clock latch 413 may cause MUX 411 to switch from data_A 441 to data_B 443. If an opposite edge is not detected, MUX 411 may continue to enable data_A 441. Otherwise, MUX 411 may switch to data_B 443 and the method may enter another wait time in block 1106.

Data_B 443 from the output of MUX 411 may be delayed through variable delay 417a (block 1106). As described above for data_A 441 in block 1103, variable delay 417a may be adjusted to align arrival of data_B 443 to the selected memory location (e.g., register 401b) after register 401b has been selected by decode logic 435 based on add_B 444. Under various conditions, add_B 444 may be delayed through variable delay 417b instead of or in addition to delaying data_B 443 through variable delay 417a. Variable delays 417a and 417b may be adjusted for each write operation in some embodiments, while, in other embodiments, a longer period of time between adjustments may be exercised. In some embodiments, another processor within SoC 100 may monitor current operating conditions and indicate an adjustment to variable delays 417a and/or 417b is required if one or more operational parameters cross a threshold value. In some embodiments, variable delays 417a or 417b may be adjusted independently of the execution of write operations, while in other embodiments, adjustments to variable delays 417a and 417b may be applied between write operations.

Data_B 443 may be written to register 401b (block 1107). Variable delay 417a may allow data_B 443 to arrive at register 401b after register 401b has been selected yet with sufficient time to complete the write operation, as described for data_A 441 in block 1104. The method may end in block 1108.

It is noted that method 1100 of FIG. 11 is merely an example. In other embodiments, a different number of operations may be included. In some embodiments, some operations may be performed in a different order and/or in parallel.

Numerous variations and modifications will become apparent to those skilled in the art once the above disclosure is fully appreciated. It is intended that the following claims be interpreted to embrace all such variations and modifications.

What is claimed is:

1. A memory, comprising:
   a memory array;
   a first data latch configured to sample a first data value responsive to a first edge of a first clock signal, wherein the first data value is to be stored in the memory array;
   a second data latch configured to sample a second data value responsive to the first edge of the first clock signal, wherein the second data value is to be stored in the memory array; and
   circuitry configured to:
      detect the first edge of the first clock signal;
      select an output of the first data latch responsive to detecting the first edge of the first clock signal;
      detect a subsequent opposite edge of the first clock signal;
      select an output of the second data latch responsive to detecting the subsequent opposite edge of the first clock signal;
      generate a second clock signal dependent upon the first clock signal, wherein a frequency of the second clock signal is twice a frequency of the first clock signal;
      generate a third clock signal dependent upon the first clock signal, wherein a frequency of the third clock signal is twice the frequency of the first clock signal, and wherein a duty cycle of the third clock signal is different than a duty cycle of the second clock signal; and select one of the second clock signal and the third clock signal to generate a decoding clock signal, wherein the selection is dependent upon one or more operational parameters.

2. The memory of claim 1, wherein the circuitry is further configured to:

decode at least a portion of a first address responsive to a first active edge of the decoding clock signal, wherein the first address indicates a location in the memory array to store the first data value; and decode at least a portion of a second address responsive to a second active edge of the decoding clock signal, wherein the second address indicates a location in the memory array to store the second data value.

3. A memory comprising:

a memory array;

a first data latch configured to sample a first data value responsive to a first edge of a first clock signal, wherein the first data value is to be stored in the memory array;

a second data latch configured to sample a second data value responsive to the first edge of the first clock signal, wherein the second data value is to be stored in the memory array; and circuitry configured to:

detect the first edge of the first clock signal;

select an output of the first data latch responsive to detecting the first edge of the first clock signal;

detect a subsequent opposite edge of the first clock signal; and select an output of the second data latch responsive to detecting the subsequent opposite edge of the first clock signal;

wherein to detect the first edge of the first clock signal, the circuitry is further configured to set a latch, and wherein to detect the subsequent opposite edge of the first clock signal the circuitry is further configured to reset the latch responsive to the subsequent opposite edge of the first clock signal and a determination that the latch is set.

4. The memory of claim 1, wherein the circuitry is further configured to:

delay storage of the first data to the memory array for a predetermined period of time; and delay storage of the second data to the memory array for the predetermined period of time;

wherein the predetermined period of time is dependent upon the one or more operational parameters.

5. The memory of claim 1, wherein the one or more operational parameters include an indication of a voltage level of a power supply coupled to the memory.

6. The memory of claim 1, wherein the first edge of the first clock signal corresponds to a rising edge and wherein the opposite edge of the first clock signal corresponds to a falling edge.

7. A method for writing data to a memory, the method comprising:

detecting a first edge of a first clock signal;

sampling a first portion and a second portion of data responsive to the first edge of the first clock signal;

selecting the first portion of data responsive to the first edge of the first clock signal;

detecting a subsequent opposite edge of the first clock signal;

selecting the second portion of the data responsive to detecting the subsequent opposite edge of the first clock signal;

generating a second clock signal dependent upon the first clock signal, wherein a frequency of the second clock signal is twice a frequency of the first clock signal;

generating a third clock signal dependent upon the first clock signal, wherein a frequency of the third clock signal is twice the frequency of the first clock signal, and wherein a duty cycle of the third clock signal is different than a duty cycle of the second clock signal; and selecting one of the second clock signal and the third clock signal to generate a decoding clock signal, wherein the selection is dependent upon one or more operational parameters.

8. The method of claim 2, further comprising:

decoding at least a portion of a first address responsive to a first active edge of the decoding clock signal, wherein the first address indicates a location in the memory to store the first portion of data; and decoding at least a portion of a second address responsive to a subsequent second active edge of the decoding clock signal, wherein the second address indicates a location in the memory to store the second portion of data.

9. The method of claim 2, further comprising:

delaying storage of the first data to the memory for a predetermined period of time; and delaying storage of the second data to the memory for the predetermined period of time;

wherein the predetermined period of time is dependent upon the one or more operational parameters.

10. The method of claim 2, wherein the one or more operational parameters include an indication of an operating temperature of the memory.

11. The method of claim 2, wherein the first edge of the first clock signal corresponds to a rising edge, and wherein the opposite edge of the first clock signal corresponds to a falling edge.

12. A method comprising:

detecting a first edge of a first clock signal;

sampling a first portion and a second portion of data responsive to the first edge of the first clock signal;

selecting the first portion of data responsive to the first edge of the first clock signal;

detecting a subsequent opposite edge of the first clock signal; and selecting the second portion of the data responsive to detecting the subsequent opposite edge of the first clock signal;

wherein the first edge of the first clock signal corresponds to a rising edge;

wherein the opposite edge of the first clock signal corresponds to a falling edge; and wherein detecting the rising edge of the first clock signal further comprises setting a latch, and wherein detecting the subsequent falling edge of the first clock signal further comprises resetting the latch responsive to the subsequent falling edge of the first clock signal and a determination that the latch is set.

13. A system, comprising:

a processor; and a memory configured to:

detect a first edge of a first clock signal;

sample a first portion and a second portion of data received from the processor, responsive to detecting the first edge of the first clock signal;

select the first portion of data responsive to detecting the first edge of the first clock signal;

detect a subsequent opposite edge of the first clock signal;

select the second portion of the data responsive to detecting the subsequent opposite edge of the first clock signal;

generate a second clock signal dependent upon the first clock signal, wherein a frequency of the second clock signal is twice a frequency of the first clock signal;

generate a third clock signal dependent upon the first clock signal, wherein a frequency of the third clock signal is twice the frequency of the first clock signal, and wherein a duty cycle of the third clock signal is different than a duty cycle of the second clock signal; and select one of the second clock signal and the third clock signal to generate a decoding clock signal, wherein the selection is dependent upon one or more operational parameters.

14. The system of claim 3, wherein the memory is further configured to:

decode at least a portion of a first address received from the processor responsive to a first active edge of the decoding clock signal, wherein the first address indicates a location in the memory to store the first portion of data; and decode at least a portion of a second address received from the processor responsive to a subsequent second active edge of the decoding clock signal, wherein the second address indicates a location in the memory to store the second portion of data.

15. The system of claim 3, wherein the memory is further configured to:

delay storage of the first data to the memory for a predetermined period of time; and delay storage of the second data to the memory for the predetermined period of time;

wherein the predetermined period of time is dependent upon the one or more operational parameters.

16. The system of claim 3, wherein the first edge of the first clock signal corresponds to a rising edge, and wherein the opposite edge of the first clock signal corresponds to a falling edge.

17. A system comprising:

a processor; and a memory configured to:

detect a first edge of a first clock signal;

sample a first portion and a second portion of data received from the processor, responsive to detecting the first edge of the first clock signal;

select the first portion of data responsive to detecting the first edge of the first clock signal;

detect a subsequent opposite edge of the first clock signal; and select the second portion of the data responsive to detecting the subsequent opposite edge of the first clock signal;

wherein the first edge of the first clock signal corresponds to a rising edge;

wherein the opposite edge of the first clock signal corresponds to a falling edge; and wherein to detect the rising edge of the first clock signal, the memory is further configured to set a latch, and wherein to detect the subsequent falling edge of the first clock signal the memory is further configured to reset the latch responsive to the subsequent falling edge of the first clock signal and a determination that the latch is set.

18. The memory of claim 1, wherein the one or more operational parameters include a voltage level of a power supply.

19. The method of claim 2, wherein the one or more operational parameters include a current temperature reading.

20. The system of claim 3, wherein the one or more operational parameters include a frequency of the first clock signal.

* * * * *